US006720769B2

(12) United States Patent
Gerald, II. et al.

(10) Patent No.: US 6,720,769 B2
(45) Date of Patent: Apr. 13, 2004

(54) ROTATIONAL EXCHANGE GRADIENT IMAGER FOR IN SITU MAGNETIC RESONANCE ANALYSES IN ULTRACENTRIFUGE SEDIMENTATION OF BIOLOGICAL MATERIALS AND RHEOLOGY INVESTIGATIONS

(75) Inventors: Rex E. Gerald, II., Brookfield, IL (US); Robert J. Klingler, Westmont, IL (US); Jerome W. Rathke, Lockport, IL (US)

(73) Assignee: The University of Chicago, Chicago, IL (US)

( * ) Notice: Subject to any disclaimer, the term of this patent is extended or adjusted under 35 U.S.C. 154(b) by 0 days.

(21) Appl. No.: 10/177,189

(22) Filed: Jun. 21, 2002

(65) Prior Publication Data

US 2003/0052678 A1 Mar. 20, 2003

Related U.S. Application Data

(60) Provisional application No. 60/308,412, filed on Jul. 27, 2001.

(51) Int. Cl.[7] .............................................. G01V 3/00
(52) U.S. Cl. ...................................................... 324/318
(58) Field of Search ................................. 324/307, 309, 324/318, 322

(56) References Cited

U.S. PATENT DOCUMENTS

| | | | | |
|---|---|---|---|---|
| 4,739,270 A | * | 4/1988 | Daugaard et al. | 324/321 |
| 4,859,949 A | * | 8/1989 | McKenna | 324/321 |
| 5,045,793 A | | 9/1991 | Rathke | |
| 5,159,271 A | * | 10/1992 | Llor | 324/321 |
| 5,574,370 A | | 11/1996 | Woelk et al. | |
| 5,644,235 A | * | 7/1997 | Baltusis | 324/321 |
| 5,729,142 A | * | 3/1998 | Baltusis | 324/321 |
| 5,754,048 A | * | 5/1998 | Bielecki | 324/321 |
| 6,046,592 A | | 4/2000 | Rathke et al. | |
| 6,191,583 B1 | | 2/2001 | Gerald, II et al. | |
| 6,204,665 B1 | * | 3/2001 | Triebe et al. | 324/318 |
| 6,538,444 B2 | * | 3/2003 | Gerald et al. | 324/318 |

OTHER PUBLICATIONS

Rex E. Gerald II et al., "Rotational Exchange Gradient Imager Invention", Argonne National Laboratory Chemical Technology Division, 42nd Rocky Mountain Conference on Analytical Chemistry—Jul. 30–Aug. 3, 2000; Denver CO; web page http://www.cmt.anl.gov.*

"Angular Flow in Toroid Cavity Probes" by Peter Trautner et al., Journal of Magnetic Resonance 151, 1–7 2001.

* cited by examiner

*Primary Examiner*—Christopher W. Fulton
*Assistant Examiner*—Dixomara Vargas
(74) *Attorney, Agent, or Firm*—Joan Pennington (57) ABSTRACT

A detecting method and detector expands the capabilities of Nuclear Magnetic Resonance (NMR) analysis. A Rotational Exchange Gradient Imager (REGI) allows for real-time, in situ investigation of materials subjected to the effects of centrifugal force by NMR analysis. The REGI comprises a cylindrical stator formed of an electrically conductive, non-magnetic material, a rotor contained in the cylindrical stator formed of an electrically non-conductive, non-magnetic material, and a conductor located along a central axis of the cylindrical stator. A sample is contained within the rotor. The stator and central conductor serve to generate the RF magnetic field for NMR analysis. The rotor containing the sample is rotated within a stable air bearing formed between the cylindrical stator and rotor.

20 Claims, 9 Drawing Sheets

ROTATIONAL EXCHANGE GRADIENT IMAGER FOR IN SITU MAGNETIC RESONANCE ANALYSES IN ULTRACENTRIFUGE SEDIMENTATION OF BIOLOGICAL MATERIALS AND RHEOLOGY INVESTIGATIONS

This application claims the benefit of U.S. Provisional Application No. 60/308,412, filed on Jul. 27, 2001.

CONTRACTUAL ORIGIN OF THE INVENTION

The United States Government has rights in this invention pursuant to Contract No. W-31-109-ENG-38 between the United States Government and Argonne National Laboratory.

FIELD OF THE INVENTION

The present invention relates nuclear magnetic resonance (NMR) imaging; and more particularly, to a novel Rotational Exchange Gradient Imager (REGI) and methods for in situ magnetic resonance analyses, for example, in ultracentrifuge sedimentation of biological materials and rheology investigations of soft matter.

DESCRIPTION OF THE RELATED ART

Nuclear magnetic resonance (NMR) analysis is a powerful method by which to determine chemical structures and to examine reaction dynamics in a diversity of chemical and biochemical systems.

For example, U.S. Pat. No. 5,574,370, issued Nov. 12, 1996 to Woelk et al., discloses a toroid cavity detection (TCD) system for determining the spectral properties and distance from a fixed point for a sample using Nuclear Magnetic Resonance. The detection system consists of a toroid with a central conductor oriented along the main axis of the toroidal cylinder and parallel to a static uniform magnetic field, $B_0$. An RF signal is inputted to the central conductor to produce a magnetic field $B_1$ perpendicular to the central axis of the toroid and whose field strength varies as the inverse of the radial position within the toroid. The toroid cavity detection system can be used to encapsulate a sample, or the detection system can be perforated to allow a sample to flow into the detection device or to place the samples in specified sample tubes. The central conductor can also be coated to determine the spectral properties of the coating and the coating thickness. The sample is then subjected to the respective magnetic fields and the responses measured to determine the desired properties.

U.S. Pat. No. 6,046,592, issued Apr. 4, 2000 to Rathke et al., discloses a near-electrode imager for employing nuclear magnetic resonance imaging to provide in situ measurements of electrochemical properties of a sample as a function of distance from a working electrode. The near-electrode imager uses the radio frequency field gradient within a cylindrical toroid cavity resonator to provide high-resolution nuclear magnetic resonance spectral information on electrolyte materials.

U.S. Pat. No. 6,191,583, issued Feb. 20, 2001 to Gerald II, discloses a toroid cavity detector that includes an outer cylindrical housing through which extends a wire along the central axis of the cylindrical housing from a closed bottom portion to the closed top end of the cylindrical housing. In order to analyze a sample placed in the housing, the housing is placed in an externally applied static main homogeneous magnetic field ($B_0$). An RF current pulse is supplied through the wire such that an alternately energized and de-energized magnetic field ($B_1$) is produced in the toroid cavity. The field $B_1$ is oriented perpendicular to the field $B_0$. Following the RF current pulse, the response of the sample to the applied field $B_0$ is detected and analyzed. In order to minimize the detrimental effect of probe ringing, the cylindrically shaped housing is elongated sufficiently in length so that the top and bottom portions are located in weaker, fringe areas of the static main magnetic field $B_0$. In addition, a material that tends to lessen the effect of probe ringing is positioned along the top and bottom ends of the toroid cavity. In another embodiment, a plug is positioned adjacent the inside of the top and bottom ends of the toroid cavity so that the sample contained in the toroid cavity is maintained in the strongest and most homogeneous region of the static magnetic field $B_0$.

The subject matter of each of the U.S. Pat. Nos. 5,574,370, 6,046,592, and 6,191,583 is incorporated herein by reference.

A special type of NMR detector, a Magic Angle Spinning NMR (MAS NMR) detector can be used to examine solids. Analysis of solid materials by MAS NMR requires rapid rotation of the sample about the axis that defines an angle of 54.7° with respect to the static magnetic field $B_0$. Other researchers have used magic angle spinning NMR to study heterogeneous catalyzed reactions at elevated pressures. Several technical problems, however, limit the use of this technique. For flow-through reactions, which include most industrial processes, the need for rotating seals limits attainable pressures to ~80 pounds per square inch (psi) (~5.5 kPa). Glass, plastic, or ceramic pressure vessels are brittle and further limit pressures to less than 100 psi (~6.9 kPa). Metal containers are thus necessary for the high pressures used in industrial applications, but they require that a radio frequency (RF) detector coil be positioned inside the container. Enclosing the RF coil in a metal container complicates the apparatus significantly because the electromagnetic field generated by the RF coil strongly interacts with the electronically conductive surfaces of the metal container. This electromagnetic interaction reduces the sensitivity and the overall performance of the detector.

At this time, several technical issues including the need for rotating seals and high pressures, and the like, limit the use of this high pressure MAS NMR technique. In situ investigations by NMR spectroscopy and imaging of the processes of sedimentation of proteins, deformations of soft materials, lubrication, and heterogeneous catalysis under high flow-through gas pressure have not been performed because a suitable device is not available.

A principal object of the present invention is to provide a novel Rotational Exchange Gradient Imager (REGI) for in situ nuclear magnetic resonance analyses, for example, in ultracentrifuge sedimentation of biological materials and rheology investigations of soft matter.

It is another object of the present invention to provide methods for in situ nuclear magnetic resonance analyses, for example, in ultracentrifuge sedimentation of biological materials and rheology investigations of soft matter.

It is another object of the present invention to provide a Rotational Exchange Gradient Imager (REGI) suitable for in situ investigations of the sedimentation process and constituent analyses of protein mixtures.

It is another object of the present invention to provide a Rotational Exchange Gradient Imager (REGI) suitable for investigations of soft matter under conditions where the material is deformed by the application of a large centrifugal force.

It is another object of the present invention to provide a Rotational Exchange Gradient Imager (REGI) suitable for spectroscopic analysis of a lubricant layer at the interfaces of a metal sleeve bearing under actual operating conditions.

It is another object of the present invention to provide a Rotational Exchange Gradient Imager (REGI) suitable for investigations of solid catalysts under conditions of high pressure and temperature, and flow of reactant gases through a catalyst bed.

It is another object of the present invention to provide a Rotational Exchange Gradient Imager (REGI) and method for implementing such Rotational Exchange Gradient Imager (REGI) substantially without negative effect and that overcome some disadvantages of prior art arrangements.

SUMMARY OF THE INVENTION

In brief, a novel detector and detecting methods are provided that expand the capabilities of Nuclear Magnetic Resonance (NMR) analysis and NMR analytical methods, allowing non-conventional materials to be examined using NMR in real time. A novel Rotational Exchange Gradient Imager (REGI) enables, for example, in situ magnetic resonance analyses in ultracentrifuge sedimentation of biological materials and rheology investigations of soft matter. The Rotational Exchange Gradient Imager (REGI) allows for real-time, in situ investigation of materials subjected to the effects of a centrifugal force by Nuclear Magnetic Resonance (NMR) analyses. The REGI comprises a cylindrical stator formed of an electrically conductive, non-magnetic material, a rotor contained in the cylindrical stator formed of an electrically non-conductive material, and a conductor located along a central axis of the cylindrical stator. A sample is contained within the rotor. The stator and central conductor serve to generate the RF magnetic field for NMR analysis. The rotor containing the sample is rotated within a stable air bearing formed between the cylindrical stator and rotor.

In a first embodiment of the invention, the rotor is driven by a high-pressure carrier gas jet containing reactant gas delivered to the inside of the stator via a closed loop formed of a pump and a pair of tubes, each tube coupled between the pump and a respective opening in the cylindrical stator. The central conductor and the cylindrical stator and rotor are held at a predefined magic angle relative to an externally applied static uniform magnetic field $B_0$. Throughout the analysis, the sample contained within the rotor is rotated by the high-pressure carrier gas jet containing reactant gas, enabling accurate and precise control of the rotation frequency.

In a second embodiment of the invention, an air jet drives the rotor. In this embodiment, the central conductor is oriented along the main axis of the cylindrical stator and rotor and parallel to the static uniform magnetic field $B_0$. An RF signal is inputted to the central conductor to produce a magnetic field $B_1$ perpendicular to the central axis of the cylindrical stator and rotor. The produced magnetic field $B_1$ is perpendicular to the static uniform magnetic field $B_0$ and the predefined magic angle is not used.

In a third embodiment of the invention, a mechanical drive assembly drives the rotor. The mechanical drive assembly is coupled to the rotor and includes a drive motor and a drive gear. As in the second embodiment, a produced magnetic field $B_1$ is perpendicular to the static uniform magnetic field $B_0$ and the predefined magic angle is not used.

In accordance with features of the invention, the REGI allows real time NMR analysis and imaging of processes, enabling fast, easy, accurate, and precise adjustment of the rotation frequency and duration of the NMR analysis. REGI allows in situ NMR analysis and imaging of processes not possible before; for example, sedimentation of proteins, deformations of soft materials, lubrication, and heterogeneous catalysis under high flow-through gas pressure. The Rotational Exchange Gradient Imager (REGI) can provide highly detailed information, through NMR spectroscopy and imaging, in four diverse fields of science: molecular biology, rheology, tribology, and heterogeneous catalysis.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, a new and useful analytical device, a Rotational Exchange Gradient imager (REGI) enables real-time, in situ investigations by nuclear magnetic resonance (NMR) of materials subjected to the effects of a centrifugal force. The REGI detector can provide highly detailed information, through NMR spectroscopy and imaging, in four diverse fields of science: molecular biology, rheology, tribology, and heterogeneous catalysis. The REGI provides for the first-time highly informative NMR spectra of systems that are difficult to investigate under actual system conditions.

Figure 1:
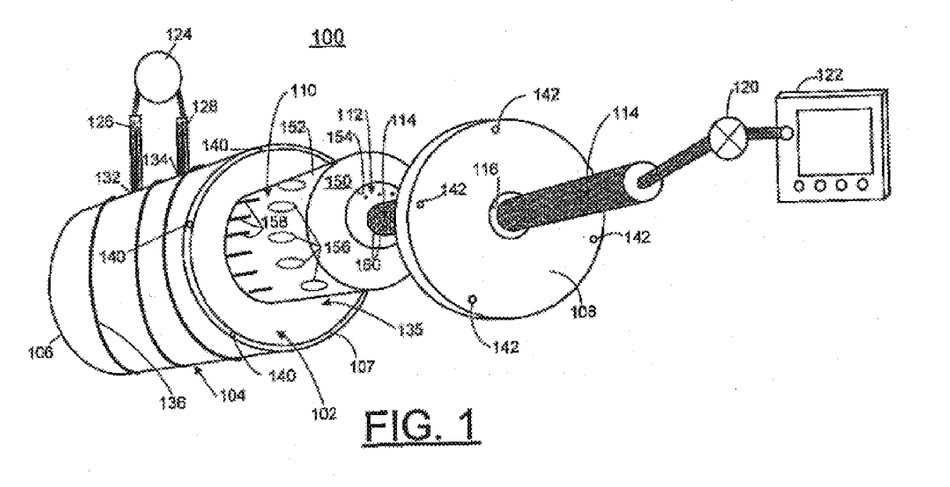
FIG. 1 is a schematic diagram illustrating a Rotational Exchange Gradient Imager (REGI) of the preferred embodiment.
Figure 8:
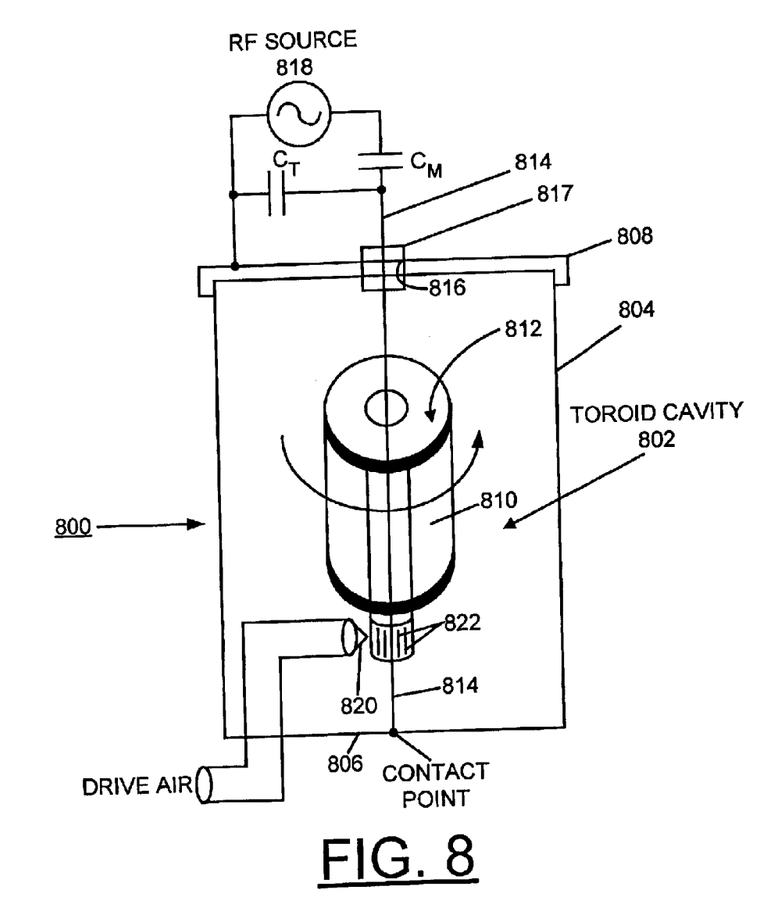
FIG. 8 is a schematic diagram illustrating a second embodiment of a Rotational Exchange Gradient Imager (REGI) of the preferred embodiment.
Figure 9:
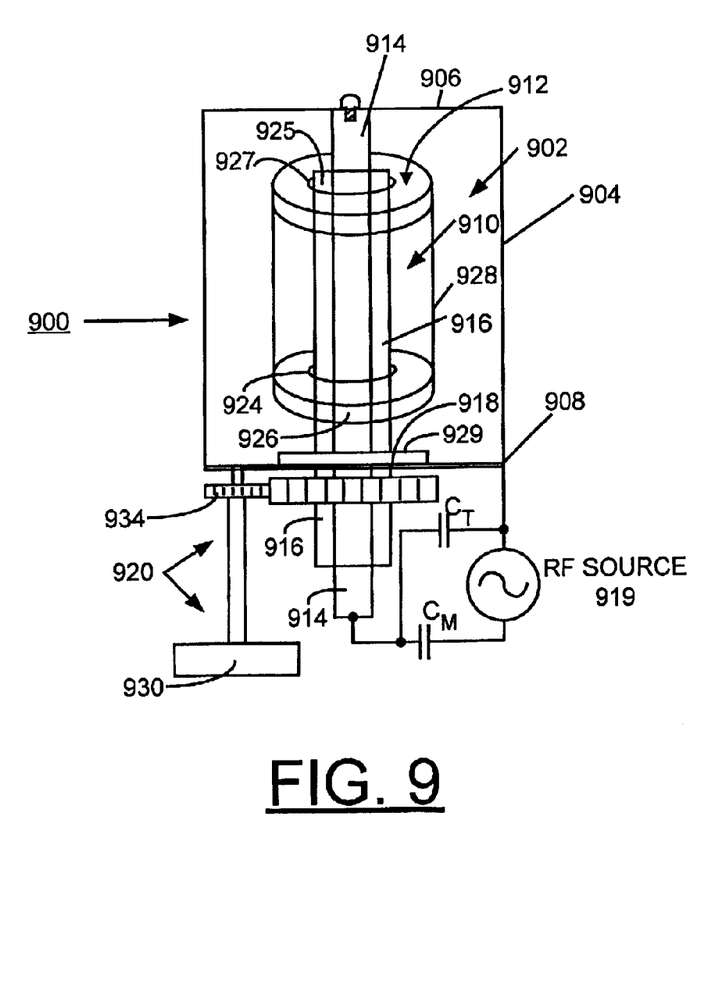
FIG. 9 is a schematic diagram illustrating a third embodiment of a Rotational Exchange Gradient Imager (REGI) of the preferred embodiment.

In accordance with features of the invention, three embodiments for the REGI are provided as illustrated and described with respect to FIGS. 1, 8 and 9. The REGI has diverse potential applications, including the development of improved fuel cells and processes for the petroleum and chemical industries. In molecular biology the REGI is suitable for in situ investigations of the sedimentation process and constituent analyses of protein mixtures. In rheology the REGI is suitable for investigations of soft matter under conditions where the material is deformed by the application of a large centrifugal force. In tribology the REGI is suitable for spectroscopic analysis of a lubricant layer at the interfaces of a metal sleeve bearing under actual operating conditions. In heterogeneous catalysis the REGI is suitable for investigations of solid catalysts under conditions of high pressure and temperature, and flow of reactant gases through the catalyst bed.

Having reference now to the drawings, in FIG. 1 there is shown not to scale a rotational exchange gradient imager (REGI) of the preferred embodiment generally designated by the reference character 100. As illustrated in FIG. 1, REGI 100 is arranged as a magic angle spinning toroid cavity detector (MAS TCD) imager including a high-pressure reactant gas used as a rotational drive source.

REGI 100 includes a toroid cavity generally designated by 102. Toroid cavity 102 is defined by a stator 104 in the form of a hollow cylinder including a base 106 at a closed end and an opposite open end 107 receiving a cap 108. Cap 108 is shown separated from the cylindrical stator 104 in FIG. 1. When assembled, cap 108 is secured to the cylindrical stator 104, for example, by fasteners (not shown) such that an enclosed toroid cavity 102 is formed. A rotor 110 is contained within the stator 104. A catalyst sample generally designated 112 is contained in the ceramic rotor 110. The cylindrical stator 104 defines the toroid cavity resonator with an egress tube 114 serving as its central conductor. The central conductor egress tube 114 is a hollow, elongated, electrically conductive tube. The central conductor egress tube 114 is fixedly secured to the stator base 106 and extends along a central, elongated axis of the toroid cavity 102 through an aligned, central aperture 116 in cap 108.

A bleed-off valve and regulator 120 maintain a reduced pressure in the egress tube 114 and draw off the products of the reaction for analysis by gas chromatography, mass spectrometry, or other methods with an associated instrument 122. A circulator pump 124 drives the rotor 110 and produces very high pressures. High-pressure carrier gas doped with reactant gases circulates in a closed loop including an entrance tube 126 and an exit tube 128, each coupled between the circulator pump 124 and the cylindrical stator 104. The cylindrical stator 104 is drilled or otherwise formed to provide an entrance opening 132 and an exit opening 134 to respectively receive the entrance and exit tubes 126 and 128. The rotor 110 is propelled by a jet of carrier gas containing one or more reactants and is supported by a gas bearing generally indicated by 135 and rotated at a selected speed, for example, up to 50,000 revolutions per second, around the stationary central conductor egress tube 114. A heater 136 is mounted on the cylindrical stator 104 for temperature control of the cylindrical stator.

Cylindrical stator 104 is formed of electrically conductive, non-magnetic material having sufficient mechanical strength for high-pressure applications. For example, stator 104 is formed of copper, beryllium copper (BeCu), aluminum, phosphor bronze or titanium. The cap 108 similarly is formed of electrical conductive, non-magnetic material having sufficient mechanical strength for high pressure. The cap 108 can be formed of aluminum, copper or beryllium copper (BeCu). Open end 107 of the cylindrical stator 104 include a plurality of openings 140 aligned with a plurality of corresponding openings 142 provided in the cap 108 for receiving fasteners for mechanically sealing for pressures greater than atmosphere and electrically connecting the cylindrical stator 104 and cap 108 together.

The rotor 110 is formed of an electrically non-conductive, non-magnetic material, such as a ceramic, plastic or glass material. The rotor 110 is an elongated, cylindrical rotor body 150 having an outside surface 152 and an inside surface 154. The sample 112 is contained inside the cylindrical rotor body 150. The cylindrical rotor body 150 includes a plurality of apertures 156 extending between the outside surface 152 and the inside surface 154. The radial rotor apertures 156 allow the high-pressure gas reactant to flow to and through the sample 112. The cylindrical rotor body 150 includes a plurality of vanes 158 adapted for rotation of the rotor 110 by the jet of high pressure carrier gas containing one or more reactants supplied by the circulating pump 124. The jet of gas containing one or more reactants rotates the rotor 110 around the central conductor egress tube 114 at a selected rate in a range from 1–50,000 revolutions per second. The rotor 110 rotates around the central conductor egress tube 114 without touching the central conductor egress tube 114 or the cylindrical stator 104.

The central conductor egress tube 114 is formed of an electrically conductive material, such as, copper or beryllium copper (BeCu). The central conductor egress tube 114 includes a plurality of holes 160 located proximate to the sample 112 to receive products of the reaction from the sample. A flow path for the high-pressure gas reactant is provided through the radial rotor apertures 156, through the sample 112, with the central conductor egress tube 114 then supplying the products of the reaction for analysis by gas chromatography, mass spectrometry, or other methods.

In operation to analyze a sample 112 contained in the cylindrical rotor 110, REGI 100 is placed in an externally applied static uniform magnetic field $B_0$. The cylindrical stator 104 and central conductor egress tube 114 generate the RF magnetic field $B_1$ for the NMR analysis. The cylindrical stator 104, rotor 110 and central conductor egress tube 114 are held at a predefined magic angle with respect to the externally applied static uniform magnetic field $B_0$. An RF current pulse is supplied through the central conductor egress tube 114 such that the alternately energized and de-energized magnetic field $B_1$ is produced in the enclosed toroid cylindrical cavity 102. Following the RF current pulse, the response of the sample to the alternately energized $B_1$ field is detected and analyzed. REGI 100 is arranged at a predefined magic angle so that the direction of the produced magnetic field $B_1$ is offset from the static main homogeneous magnetic field $B_0$ by the magic angle. The axis of rotation is inclined at the magic angle, 54.7° with respect to the direction of the externally applied static uniform magnetic field $B_0$.

REGI 100 avoids the problem of a metal container interfering with the RF field because the container, cylindrical stator 104 itself generates the RF field. This geometry of REGI 100 has two other significant advantages over a conventional solenoid coil. First, the RF magnetic field $B_1$ is contained within the cavity 102, so that it can be generated more efficiently. The high efficiency increases the sensitivity of the REGI 100. Second, the strength of the RF magnetic field $B_1$ decreases with distance from the center of the stator 104. As a result, the REGI 100 has the capability to record high-resolution NMR spectra for heterogeneous samples as a function of distance on a microscopic scale.

Two characteristics of the REGI 100 allow its use at higher pressures than conventional MAS probe designs. First, the pressure vessel is provided by the stator 104 rather than the rotor 110, eliminating the need for rotating seals. Second, stator 104 forms a metal pressure vessel. This would be impractical if a conventional coil is used to generate the RF magnetic field, since currents induced in the pressure vessel would interfere with the RF magnetic field. In the REGI 100 the stator 104 defining toroid cavity 102, serves as a pressure vessel, eliminating that problem.

Figure 2:
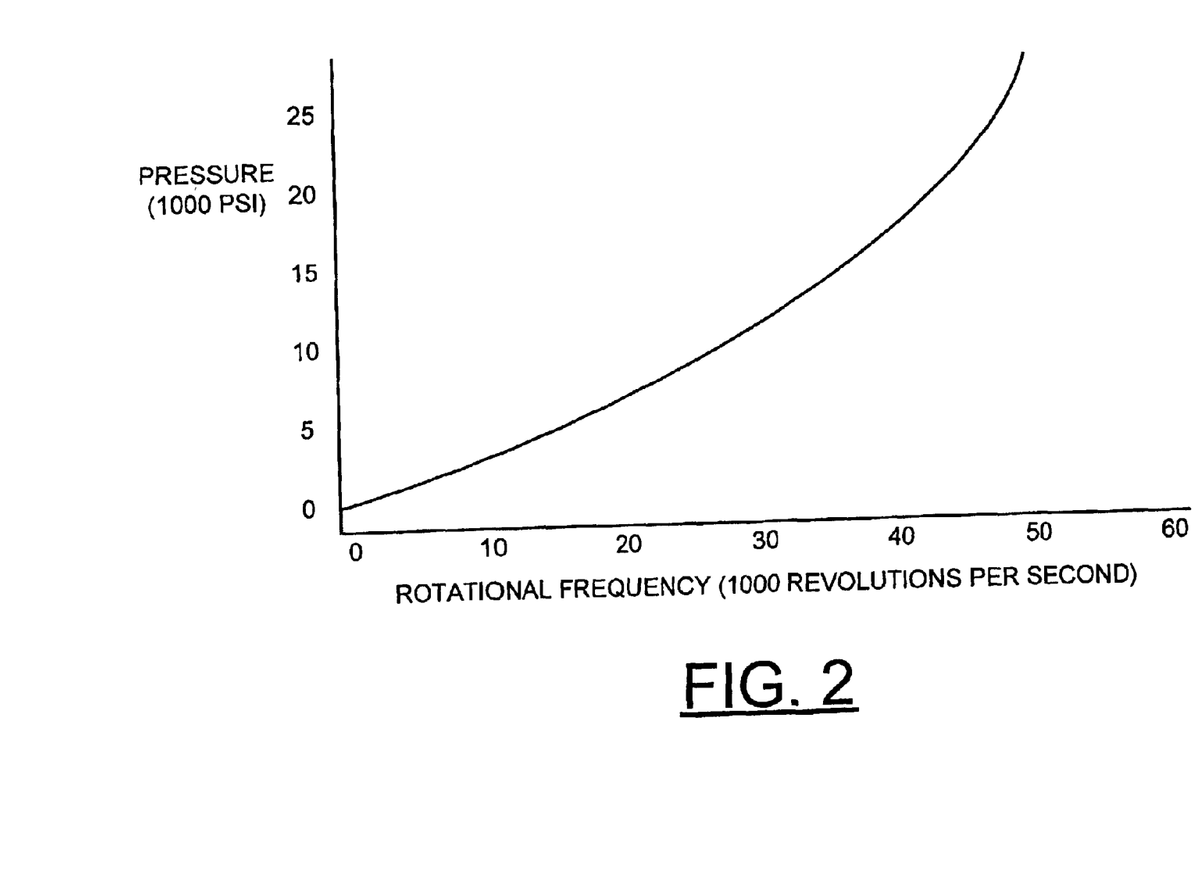
FIG. 2 is a diagram illustrating pressure with respect to the vertical axis and frequency with respect to the horizontal axis obtained with the Rotational Exchange Gradient Imager (REGI) of FIG. 1.

FIG. 2 illustrates pressure ($10^3$ psi) with respect to rotation frequency (1000 revolutions per second) obtained with the Rotational Exchange Gradient Imager (REGI) 100 of FIG. 1. REGI 100 can be used to study the behavior of solids subjected to high stresses. REGI 100 has application in tribology, and rheology because of its ability to generate stresses in solids and semisolids via centrifugal forces. The centrifugal forces in REGI 100 can produce the pressures plotted in FIG. 2, which were calculated for a 100-$\mu$m-thick annular shell of a polymer. The centrifugal forces alone in REGI 100 produce the pressures in the graph of FIG. 2 for a 100-$\mu$m-thick annular shell of solid material (powder or an easily compressible monolith) with a density of 1 g/cc and a radius of 2 mm. These conditions are readily obtainable. The stresses vary as the square of the rotation rate, providing a large range of stresses for the currently available range of spin rates. As shown by the solid circles, pressures of 200–1000 psi (1.4–6.9 MPa) are easily obtainable with REGI 100. The open circles project that stresses from pressures as high as 30,000 psi (207 MPa) can be obtained by using existing commercial rotors. Since stress inside the sample will vary with distance from the center of rotation, a radial image of the NMR spectrum will give changes in the spectrum with respect to stress. A larger variation in stress can be obtained by varying the rotation rate. Significant effects in polymers can be seen for the range of stresses obtainable by REGI 100.

In NMR, one would like to obtain a spectrum consisting of narrow peaks, since this makes it possible to distinguish closely-spaced peaks and maximize the precision with which the positions of the peaks are measured. When NMR is conducted on fluids or solutions, line widths are typically on the order of 0.1 Hz, which is satisfactory for most applications. With solids, or with macromolecules such as large proteins, the line widths can be much larger, for example, greater than 100 Hz. The causes of line broadening can be understood qualitatively as follows. The spacing between spin energy levels in a nucleus, and so the resonance frequencies associated with transitions between them, vary with the orientation of the molecule containing it. If the molecule is in a liquid or in solution, the molecule is free to rotate in a random, non-coherent manner. If the molecule is not particularly large, its Brownian motion or random and non-coherent motion will rotate the molecule fast enough that these effects are averaged out, so that nuclei in identical environments—in the same position in the same compound, and the like—all resonate at the same frequency and the result is a sharp line. If the molecules are fixed in place, as in a solid, or are so large that their Brownian motion is relatively slow, as in a large protein, then nuclei in different molecules in the sample will resonate at different frequencies as a function of their orientation and the line will be spread out.

An examination of the effects responsible for the change in resonance frequency as a result of orientation shows that most of the averaging out of these effects can be achieved by a coherent rotation about an axis making an angle of 54.7° with the direction of the fixed magnetic field. This angle is the magic angle, and the technique of rotating a sample about this angle is called Magic Angle Spinning (MAS). One area where MAS has been used extensively in the last few years is in the study of reactions involving solid catalysts. Since the processes studied in this way are widely used in the chemical and petroleum industries, researchers hope that studies in this area will bring to light new methods which will be useful to those industries.

Two aspects of industrial catalytic processes combine to make NMR of these processes difficult. First, most industrial processes are flow-through processes, where reactants are constantly streaming into a reaction chamber, and products are constantly being drawn out. Second, the reactions of interest usually take place at high temperatures and pressures. In MAS the probe has to spin during the experiment, and the joints where reactants flow into the probe and products flow out are difficult to seal beyond 80 psi at elevated temperatures.

One effect of rotation is the stress caused by centrifugal forces in the sample. For a powder or for a material with low tensile modulus (that is, a material that can be stretched or compressed easily) the stresses can be calculated as follows. In these cases the centripetal force comes mainly from the resistance of the substance to compression, so inner layers push on the outer layers increasing the pressure they experience. For a cylindrical shell of sample 112 held in a rigid rotor 110 as shown in FIG. 1 the pressure P defined by a force F per unit area A, at a distance r from the center of the cylindrical stator 104 is:

$$P = \frac{F}{A} =$$

$$\int \frac{dF}{A} = \int_{r_1}^{r} \omega^2 \rho \cdot r\, dr = \frac{\omega^2 \rho}{2}[r^2]_{r_1}^{r} = \frac{\omega^2 \rho}{2}(r^2 - r_1^2) = \frac{\omega^2 \rho}{2}(r_2^2 - r_1^2)$$

Where $r_1$ is the inner radius of the sample, $r_2$ is the outer radius of the sample, $\rho$ is the density of the sample, and $\omega$ is the angular frequency of rotation. For a very thin ring of sample this reduces to $\rho = \omega^2 \rho \cdot r_1 \Delta r$ (where $\Delta r = r_2 - r_1$)

These equations tell us three things. First, the equations give us the magnitude of the stresses involved. For a sample with $\rho = 1$ g/cc, a rotation rate of 10,000 revolutions per second, $r_1 = 2$ mm and $\Delta r = 0.1$ mm, all easily obtainable conditions, the pressure at the outer edge of the sample would be 2200 psi, roughly the yield strength of Teflon and near the yield strength of many other polymers. By examining variations in the NMR spectra with pressure of these compounds we can establish which bonds in the molecules that comprise the sample are affected by the stress. Second, the equations provide the variation of the stress with rotation rate. Third, the equations show that the stress varies with position within the sample, going to zero at its inner edge. Hence, the imaging capability of REGI 100 can be used to obtain changes in the NMR spectrum as a function of pressure.

When an easily compressible fluid, i.e. a gas or a supercritical fluid, is subjected to rotation at high speed, it will be compressed towards the edge of the container until the resulting increase in pressure balances the centrifugal force.

As for any system in thermal equilibrium, the density is given by $$\rho \propto e^{-V/kt}$$

where V is the potential energy function of the molecules involved, k is Boltzman's constant, and T is the absolute temperature. Supercritical fluids have been shown to behave very much like ideal gasses, i.e. intermolecular forces have very little effect on their behavior. V is therefore effectively only the potential energy arising from the centrifugal forces in the system, $$V(r) = \int -m\omega^2 r dr = -\frac{1}{2}m\omega^2 r^2$$

(where ω is the angular frequency of rotation and r is the distance from the axis of rotation). The density distribution can be calculated easily from these relationships. To find the expected magnitude of the effect, the calculated density distribution ratio between density at the center and edge of the container for a container 1 cm in diameter filled with carbon dioxide (m=5.3×10$^{-26}$ kg) is 1.3. This is large enough to be useful, particularly because a density gradient cannot easily be obtained except by rotation and provides an interesting way of studying a number of separations and reactions. Many useful catalysts go into solution in supercritical fluids in the core of micelle structures, which form at a particular density, so that the catalysts would be localized at a particular location in the cell. The density gradient can serve as a shuttle, carrying reactants to the micellular layer and carrying products to different layers determined by their densities. This could also be used to study the effect of the density of a supercritical fluid on reactions between substances in suspension or solution. REGI 100 provides a mechanism for in situ monitoring of the centrifugation process through its imaging capability. REGI 100 allows the use of NMR to study processes occuring during centrifugation. For example, it is now thought that some protein complexes dissociate and reassociate. REGI 100 allows the use of a direct NMR method for determining disassociation and reassociation of protein complexes in isolation. NMR analyses of protein complexes of different average molecular weight are achieved by segregation and imaging methods using the REGI 100.

Figure 3:
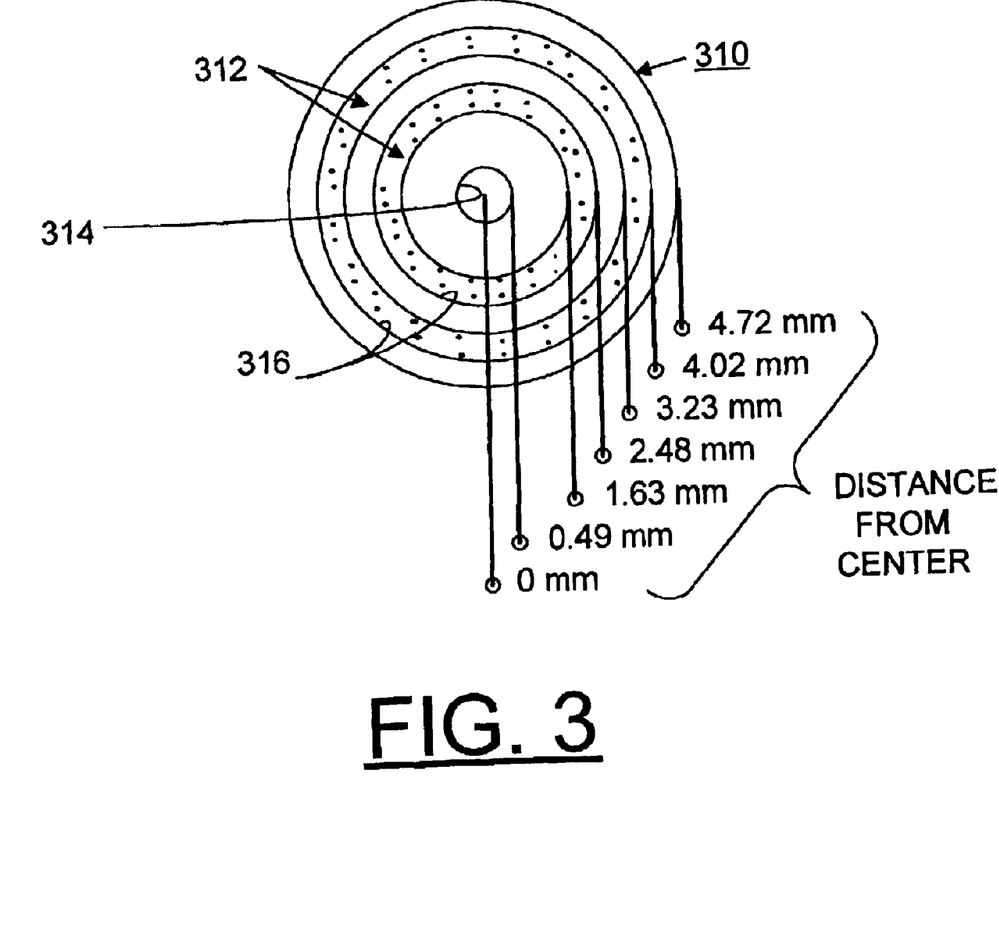
FIG. 3 illustrates an alternative rotor and sample for use in the Rotational Exchange Gradient Imager (REGI) of FIG. 1 of the preferred embodiment.

FIG. 3 illustrates an alternative rotor 310 for containing a sample generally designated by 312 for use in the Rotational Exchange Gradient Imager (REGI) 100 of FIG. 1 of the preferred embodiment. As shown in FIG. 3, rotor 310 has a centrally located hole 314 to accommodate the central conductor 114 and includes vanes (not shown) similarly arranged as rotor 110 for rotation by the drive gas. Rotor 310 is formed with a pair of grooves 316 to contain the sample 312, for example, of isoprene rubber. Rotor grooves 316 provide two clearly separated areas of sample 312. Distances from the center of the rotor 310 are shown with the rotor 310.

Figure 4:
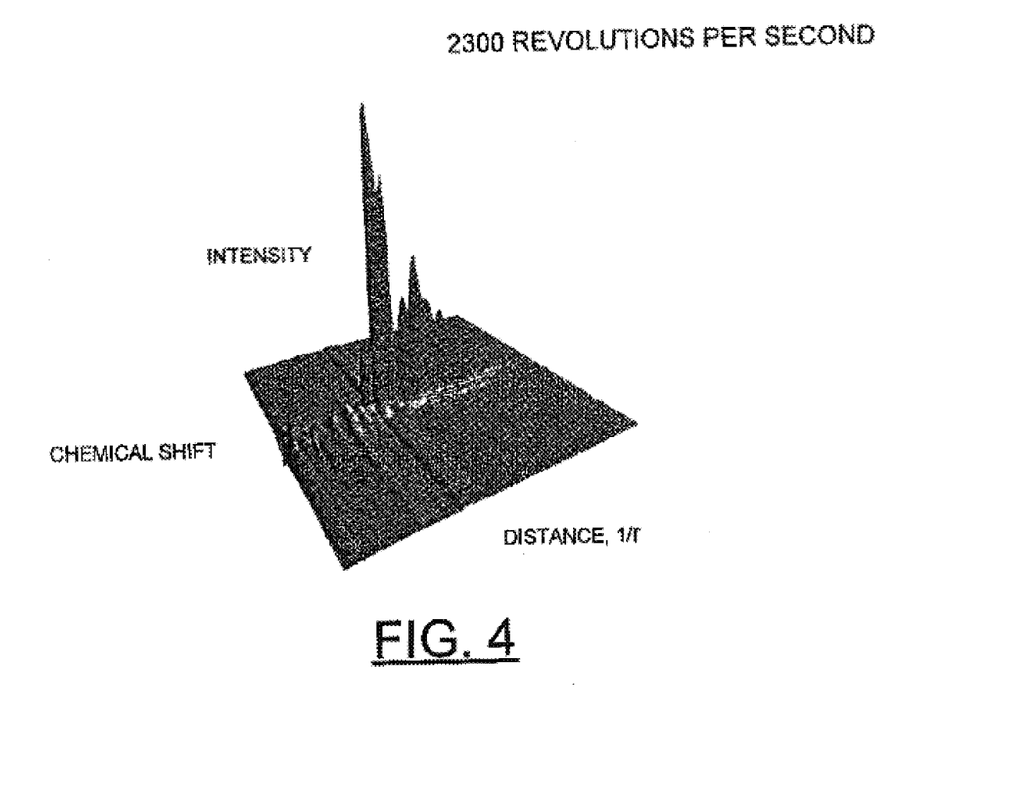
FIGS. 4 and 5 illustrates results obtained with the Rotational Exchange Gradient Imager (REGI) of FIG. 1 of the preferred embodiment at a spin rate of 2300 revolutions per second for comparison with static results obtained without rotation of a sample using the rotor of FIG. 3 with chemical shift (PPM) shown with respect to one horizontal axis, distance through the sample shown with respect to the other horizontal axis, and intensity shown with respect to the vertical axis.
Figure 5:
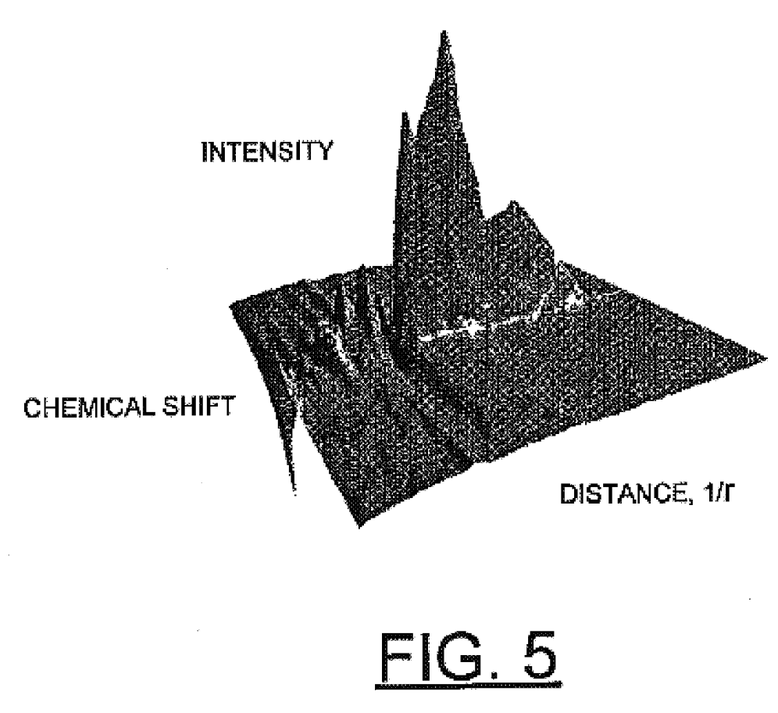

FIGS. 4 and 5 illustrate images obtained with the REGI 100 including rotor 310 and the sample 312 of FIG. 3. In FIGS. 4 and 5, chemical shift (PPM) is shown with respect to one horizontal axis with distance through the sample, 1/r shown with respect to the other horizontal axis, and intensity shown with respect to the vertical axis. FIG. 4 illustrates an image obtained by REGI 100 at a rotation frequency of 2300 revolutions per second. A stationary image is shown in FIG. 5.

Figure 6:
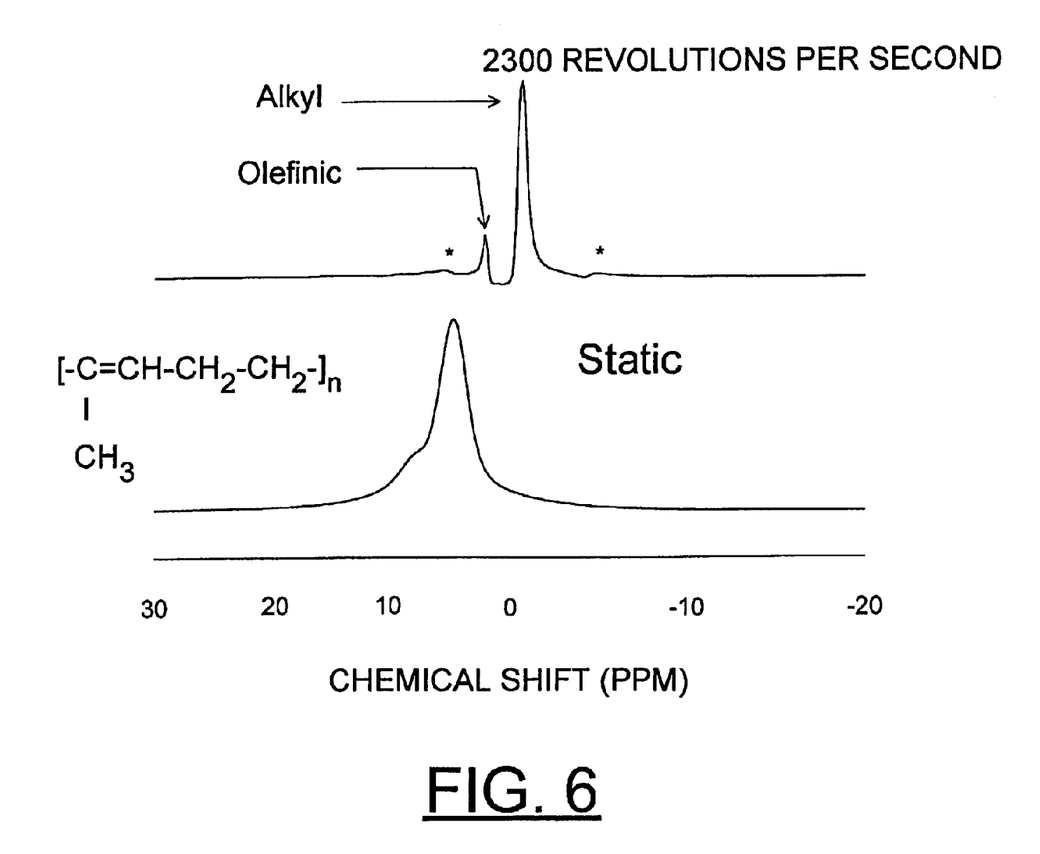
FIG. 6 illustrates results obtained with the Rotational Exchange Gradient Imager (REGI) of FIG. 1 of the preferred embodiment at a spin rate of 2300 revolutions per second for comparison with the static results obtained without rotation of a sample with chemical shift (PPM) shown with respect to the horizontal axis and intentsity shown with respect to the vertical axis.

FIG. 6 illustrates representative spectra obtained with the REGI 100 of FIG. 1 of the preferred embodiment at a spin rate of 2300 revolutions per second for comparison with a static or zero spin rate. In FIG. 6, chemical shift (PPM) is shown with respect to the horizontal axis and intentsity shown with respect to the vertical axis. FIG. 6 illustrates the ability of REGI 100 to narrow NMR signals in a sample 312 of poly(isoprene) for easy identification of the hydrocarbon species present. The single spectra clearly show that the line narrowing expected from magic angle spinning occurred, making it possible to distinguish two peaks. The broad spectrum observed for the static sample is narrowed and shifted upon rotation of the sample at 2300 revolutions per second. REGI 100 is able to resolve two distinct peaks, corresponding to the alkyl (methyl and methylene) protons at 1.9 ppm and the olefinic protons at 5.4 ppm, in the approximate intensity ratio of 7:1. The enhanced resolution of the different proton signals makes it possible to detect subtle changes in the conformations, dynamics, and packing of molecules subjected to large compressing forces. In FIG. 6, the asterisks (*) indicate the location of spinning side bands. Sidebands are small but visible, confirming the rotation rate, and a shift in the position of the spectra is evident. This shift is equal to the rotation frequency, and is unique to the present invention REGI 100. However, the shift in the position of the spectrum obtained with REGI 100 is not possible with existing MAS detectors. This spectral shift due to sample rotation may be used to advantage to distinguish a rotating solid sample from a sample coated on the egress tube 114 and not undergoing rotation. It is commonly the case that the maximum of a spectrum obtained using MAS does not correspond to that of the nonspinning spectrum.

Figure 7:
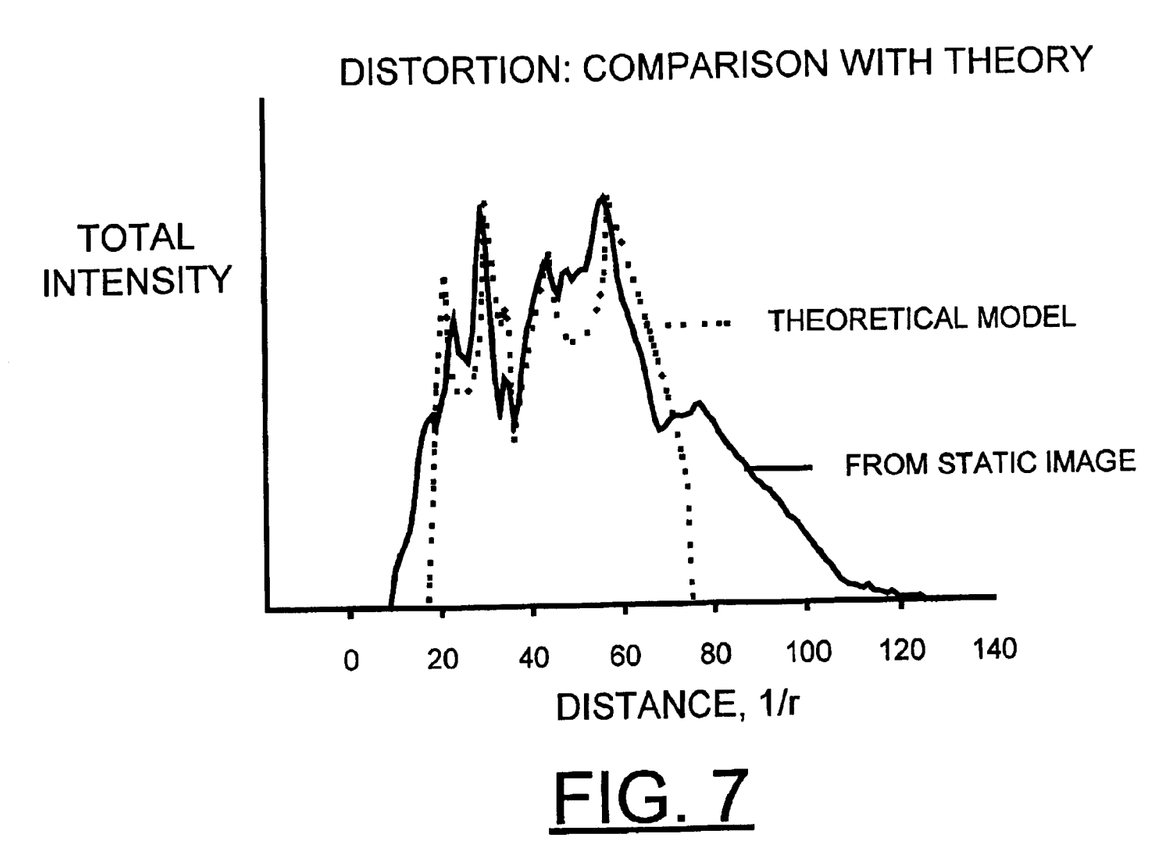
FIG. 7 is a diagram illustrating total intensity with respect to the vertical axis and distance with respect to the horizontal axis obtained with the Rotational Exchange Gradient Imager (REGI) of FIG. 1 of the preferred embodiment for comparison with theoretical curve.

FIG. 7 is a diagram illustrating total NMR intensity with respect to the vertical axis and distance with respect to the horizontal axis obtained with the Rotational Exchange Gradient Imager (REGI) 100 of the preferred embodiment for comparison with the theoretical curve.

The operation of the REGI 100 may be further understood from the following description. The analysis method of REGI 100 uses spatial variation in the RF magnetic field $B_1$ to reconstruct spatial information, where earlier methods, for example, Magnetic Resonance Imaging (MRI), use variations in the static magnetic field (the $B_0$ field). Using the $B_1$ field means that information about the chemical shift is preserved, and the result is a chart showing the response intentsity as a function of the position and chemical shift of the nuclei producing it.

In a toroid cavity probe, the magnitude of the $B_1$ field varies only with the cylindrical coordinate r, and the direction only with the cylindrical coordinate φ. Conventionally, the probe is arranged so that $B_1$ is everywhere perpendicular to $B_0$, so that the variation in the direction of the $B_1$ field is of no consequence, and an image with one spatial direction is the result. When the probe is inclined with respect to $B_0$ as in REGI 100, the varying angle between $B_0$ and $B_1$ means that the variation of $B_1$ with both r and φ is significant and must be accounted for in the image reconstruction.

In second and third embodiments, for example used for investigations of sedimentations, respective REGI are arranged without the magic angle spinning as illustrated in FIGS. 8 and 9.

Referring now to FIG. 8, there is shown a second embodiment of a Rotational Exchange Gradient Imager (REGI) of the preferred embodiment generally designated by the reference character 800. REGI 800 includes a toroid cavity generally designated by 802. Toroid cavity 802 is defined by a stator 804 in the form of a hollow metallic cylinder including a base 806 at a closed end and receiving a cap 808 at an opposite open end. A rotor 810 containing a fluid sample 812 is formed of electrically non-conductive, non-magnetic material and contained within the cylindrical stator 804. The cylindrical stator 804 defines the toroid cavity resonator with an elongated wire 814 serving as its central conductor. The central conductor 814 is fixedly secured to the stator base 806 and extends along a central, elongated axis of the toroid cavity 802 through an aligned, central aperture 816 in cap 808 and a dielectric feedthrough 817. In REGI 800, an air jet provided by a high-pressure air nozzle 820 impinges on a drive wheel member 822 of the rotor 810 and rotates the rotor 810. In REGI 800, the central conductor 814 is oriented along the main axis of the cylindrical stator 804 and parallel to a static uniform magnetic field $B_0$ and an RF signal is inputted to the central conductor 814 from an RF source 818 via a matching capacitor Cm with a tuning capacitor Ct connected between the junction of matching capacitor Cm and the central conductor 814 and the cap 808. RF signal applied to the central conductor 814 produces a magnetic field $B_1$ perpendicular to the central axis of the cylindrical stator. The produced magnetic field $B_1$ is perpendicular to the static uniform magnetic field $B_0$ and the predefined magic angle is not used. Throughout the analysis, the air jet rotates the rotor 810 together with the sample 812.

Referring now to FIG. 9, there is shown a third embodiment of a Rotational Exchange Gradient Imager (REGI) of the preferred embodiment generally designated by the reference character 900. In REGI 900, a mechanical drive assembly generally designated by 920 drives the rotor. REGI 900 includes a toroid cavity generally designated by 902. Toroid cavity 902 is defined by a stator 904 in the form of a hollow metallic cylinder including a top 906 at a closed end and receiving a base member 908 at an opposite open end. Base member 908 is secured to the cylindrical stator 904 to form the enclosed toroid cavity 902. A rotor 910 containing a fluid sample 912 is contained within the cylindrical stator 904. Rotor 910 includes an elongated inner tube 916. Elongated inner tube 916 extends through an aligned, central aperture 918 in base member 908. Inner and outer seals 924 and 926 are formed between the inner tube 916 and an outer cylinder 928 that contains sample 912. Inner and outer seals 925 and 927 are formed between the inner tube 916 and an outer cylinder 928 that contains sample 912. Rotor 910 is formed of electrically non-conductive material and a bearing stop 929, such as Teflon coated bearing stop, is provided with the rotor inner tube 916 adjacent the base member 908. The cylindrical stator 904 defines the toroid cavity resonator with an elongated, electrically conductive rod 914 serving as its central conductor. The central conductor rod 914 is fixedly secured to the stator top 906 and extends along a central, elongated axis of the toroid cavity 902 received through the rotor inner tube 916. In REGI 900, the central conductor 914 is oriented along the main axis of the cylindrical stator and parallel to a static uniform magnetic field $B_0$ oriented along the main axis of the cylindrical stator 904 and an RF signal is inputted to the central conductor 914 from an RF source 919 via a matching capacitor Cm with a tuning capacitor Ct connected between the junction of matching capacitor Cm and the central conductor 914 and the base member 908. RF signal applied to the central conductor 914 produces a magnetic field $B_1$ perpendicular to the central axis of the cylindrical stator. The produced magnetic field $B_1$ is perpendicular to the static uniform magnetic field $B_0$ and the predefined magic angle is not used.

The mechanical drive assembly 920 includes a drive motor 930 and a drive gear assembly 934 coupled to the inner tube 916 of the rotor 910 for rotation of the rotor 910. Drive gear assembly 934 may include gears formed of Teflon. The mechanical drive assembly 920 enables changing the rotational direction of the rotor 910, for example, by reversing current flow in the drive motor 930, and quickly enables stopping rotation of the rotor 910. Throughout the analysis, the mechanical drive assembly 920 rotates, stops, starts, and reverses rotational direction of the rotor 910 together with the sample 912.

While the present invention has been described with reference to the details of the embodiments of the invention shown in the drawings, these details are not intended to limit the scope of the invention as claimed in the appended claims.

What is claimed is:

1. A Rotational Exchange Gradient Imager (REGI) for real-time, in situ investigation of materials subjected to the effects of centrifugal force by nuclear magnetic resonance (NMR) analysis, said REGI comprising: a cylindrical stator defining a toroid cavity, said cylindrical stator formed of an electrically conductive, non-magnetic material, a rotor contained in the cylindrical stator formed of an electrically non-conductive, non-magnetic material, an elongated conductor extending along an elongated central axis of the cylindrical stator, said stator and said central conductor for generating an RF magnetic field for NMR analysis; said RF magnetic field having a radial field gradient with field strength being inversely proportional to radial distance from said central conductor; a sample is contained within the rotor; and a drive for rotating said rotor containing said sample within a stable gas bearing formed between said cylindrical stator and said rotor.

2. A Rotational Exchange Gradient Imager (REGI) as recited in claim 1 wherein said drive for rotating said rotor containing said sample includes a high-pressure carrier gas jet containing one or more reactants; said high-pressure carrier gas jet containing one or more reactants delivered inside of said cylindrical stator and wherein said rotor includes an outside surface and a plurality of vanes formed on said outside surface; said high-pressure carrier gas jet containing one or more reactants impinging on said rotor vanes, whereby said sample contained within said rotor is rotated by said high-pressure carrier gas jet containing one or more reactants.

3. A Rotational Exchange Gradient Imager (REGI) as recited in claim 2 wherein said high-pressure carrier gas jet containing one or more reactants delivered inside of said cylindrical stator includes a closed loop formed of a pump; a first tube coupled between said pump and an entrance opening in said cylindrical stator and a second tube coupled between said pump and an exit opening in said cylindrical stator.

4. A Rotational Exchange Gradient Imager (REGI) as recited in claim 2 wherein said rotor is a cylindrical rotor body; said sample contained inside said cylindrical rotor body; said cylindrical rotor body including a plurality of apertures extending between an outside surface of said cylindrical rotor body to inside said cylindrical rotor body, said apertures allowing said high-pressure carrier gas jet containing one or more reactants to flow to said sample.

5. A Rotational Exchange Gradient Imager (REGI) as recited in claim 4 wherein said central conductor comprising an egress tube; said rotor rotating about said central conductor egress tube without contacting said central conductor egress tube; said central conductor egress tube including a perforated central conductor egress tube.

6. A Rotational Exchange Gradient Imager (REGI) as recited in claim 1 wherein said central conductor and said cylindrical stator and rotor are held at a predefined magic angle relative to an externally applied static uniform magnetic field $B_0$.

7. A Rotational Exchange Gradient Imager (REGI) as recited in claim 1 wherein said drive for rotating said rotor containing said sample includes an air jet for driving said rotor.

8. A Rotational Exchange Gradient Imager (REGI) as recited in claim 1 wherein said drive for rotating said rotor containing said sample includes a mechanical drive assembly for driving said rotor.

9. A Rotational Exchange Gradient Imager (REGI) as recited in claim 8 wherein said mechanical drive assembly includes a drive motor and a drive gear coupled to said rotor.

10. A Rotational Exchange Gradient Imager (REGI) as recited in claim 1 wherein said cylindrical stator is formed of an electrically conductive, non-magnetic metallic material having predefined mechanical strength for containing high pressure within said cylindrical stator.

11. A Rotational Exchange Gradient Imager (REGI) as recited in claim 1 wherein said cylindrical stator is formed of a selected material, said selected material including copper, beryllium copper, aluminum, phosphor bronze and titanium.

12. A Rotational Exchange Gradient Imager (REGI) as recited in claim 1 wherein said cylindrical stator includes a cylindrical stator body having an open end and a member mounted on said open end.

13. A Rotational Exchange Gradient Imager (REGI) as recited in claim 1 wherein said rotor is formed of an electrically non-conductive, non-magnetic material.

14. A Rotational Exchange Gradient Imager (REGI) as recited in claim 1 wherein said rotor rotating about said central conductor without contacting said central conductor.

15. A nuclear magnetic resonance (NMR) analysis method for real-time, in situ investigation of materials subjected to the effects of centrifugal force comprising the steps of:

providing a cylindrical stator defining a toroid cavity, said cylindrical stator formed of an electrically conductive, non-magnetic material, a rotor contained in the cylindrical stator formed of an electrically non-conductive, non-magnetic material, and an elongated conductor extending along an elongated central axis of said cylindrical stator;

generating an RF magnetic field for NMR analysis with said stator and said central conductor; said RF magnetic field having a radial field gradient with field strength being inversely proportional to radial distance from said central conductor;

containing a sample within said rotor; and rotating said rotor containing said sample within a stable gas bearing formed between said cylindrical stator and said rotor.

16. A nuclear magnetic resonance (NMR) analysis method as recited in claim 15 wherein said step of rotating said rotor containing said sample within a stable gas bearing formed between said cylindrical stator and said rotor includes the steps of providing a mechanical drive assembly coupled to said rotor and wherein said rotor includes a elongated tube extending along said central axis of said cylindrical stator and extending outside said cylindrical stator for rotation by said mechanical drive assembly.

17. A nuclear magnetic resonance (NMR) analysis method as recited in claim 15 wherein said step of rotating said rotor containing said sample within a stable gas bearing formed between said cylindrical stator and said rotor includes the steps of delivering an air jet inside of said cylindrical stator and wherein said rotor includes a drive wheel member; said air jet impinging on said drive wheel member for rotating said rotor containing said sample.

18. A nuclear magnetic resonance (NMR) analysis method as recited in claim 15 includes the step of providing said central conductor and said cylindrical stator and rotor at a predefined magic angle relative to an externally applied static uniform magnetic field $B_0$; and wherein said step of rotating said rotor containing said sample within a stable gas bearing formed between said cylindrical stator and said rotor includes the steps of delivering a high-pressure carrier gas jet containing one or more reactants inside of said cylindrical stator and wherein said rotor includes an outside surface and a plurality of vanes formed on said outside surface; said high-pressure carrier gas jet containing one or more reactants impinging on said rotor vanes for rotating said rotor containing said sample.

19. A nuclear magnetic resonance (NMR) analysis method as recited in claim 18 includes the step of providing an egress tube for said central conductor; and wherein said rotor is a cylindrical rotor body; said sample contained inside said cylindrical rotor body; said cylindrical rotor body including a plurality of apertures extending between an outside surface of said cylindrical rotor body to inside said cylindrical rotor body, said apertures allowing said high-pressure carrier gas jet containing one or more reactants to flow through said sample; and said central conductor egress tube having holes receiving reaction products from said sample.

20. A nuclear magnetic resonance (NMR) analysis method as recited in claim 19 includes the step of providing a valve and regulator coupled to central conductor egress tube for maintaining a selected pressure in said central conductor egress tube and drawing off reaction products for analysis.

* * * * *